(12) United States Patent
Koll et al.

(10) Patent No.: US 8,026,724 B2
(45) Date of Patent: Sep. 27, 2011

(54) PROJECTION LAMP TEST DEVICE

(75) Inventors: David Koll, Portland, OR (US); Tom Else, Colton, OR (US)

(73) Assignee: Seiko Epson Corporation, Tokyo (JP)

( * ) Notice: Subject to any disclaimer, the term of this patent is extended or adjusted under 35 U.S.C. 154(b) by 726 days.

(21) Appl. No.: 12/163,620

(22) Filed: Jun. 27, 2008

(65) Prior Publication Data

US 2009/0001991 A1     Jan. 1, 2009

Related U.S. Application Data

(60) Provisional application No. 60/937,765, filed on Jun. 29, 2007.

(51) Int. Cl.
    *G01R 31/00* (2006.01)
(52) U.S. Cl. .................................................... 324/414
(58) Field of Classification Search .................... 324/414
    See application file for complete search history.

(56) References Cited

U.S. PATENT DOCUMENTS

| | | | | |
|---|---|---|---|---|
| 5,722,768 | A * | 3/1998 | Suzuki et al. | 362/265 |
| 2003/0015972 | A1 * | 1/2003 | Suzuki | 315/291 |
| 2008/0048577 | A1 * | 2/2008 | Beasley | 315/209 R |

* cited by examiner

*Primary Examiner* — Thomas Valone
(74) *Attorney, Agent, or Firm* — Kilpatrick Townsend & Stockton LLP

(57) ABSTRACT

A projector lamp electronic test circuit is provided. The test circuit includes an electrical connector configured to be operatively coupled to a lamp of a projection unit under test, a converter configured to receive a test charge to be sent to the lamp from an alternating current power source, the converter configured to convert the test charge from alternating current to direct current, and an autotransformer operatively coupled to the converter, the autotransformer configured to regulate a voltage of the test charge, the voltage being suitably high enough to cause failure of the lamp.

20 Claims, 4 Drawing Sheets

PROJECTION LAMP TEST DEVICE

CROSS REFERENCE TO RELATED APPLICATION

This application claims the benefit of U.S. Provisional Application 60/937,765, filed on Jun. 29, 2007; entitled PROJECTION LAMP PARTICLE CONTAINMENT TEST DEVICE; the entirety of which is hereby incorporated herein by reference for all purposes.

BACKGROUND

A projection lamp for a projection device may be tested to evaluate the operational robustness of the projection lamp under various operating conditions and over various operational lifecycles. In particular, a projection lamp may be tested to determine operational failure thresholds and to observe the results of operational failure of the projection lamp. In one example, a projection lamp test may include deliberately causing a projection lamp to fail, and more particularly to cause the projection lamp to rupture in order to observe and assess the results of the projection lamp rupture, namely, the amount and rate of dispersion of projection lamp particles.

In one example, a projection lamp failure test technique may include forcefully applying a mechanical rod to the projection lamp to cause the projection lamp to rupture. As another example, the projection lamp may be cooled to a temperature that causes the projection lamp to fail.

However, these test techniques may require application of mechanical components that may not exist or occur in actual operation of the projection lamp and thus may not provide an accurate failure analysis. Furthermore, the testing techniques may be imprecise. For example, the mechanical rod may be applied to different regions of the lamp during each test. Further, temperature applied during testing may vary and may affect other operating conditions which may skew testing.

SUMMARY

In one approach, a lamp of a projection device may be induced to fail by applying an electric charge directly to the lamp. In one example, a projector lamp electronic test circuit is provided. The electronic test circuit may include an electrical connector configured to be operatively coupled to a lamp of a projection unit under test. The test circuit may include a converter configured to receive a test charge to be sent to the lamp from an alternating current power source. The converter may be configured to convert the test charge from alternating current to direct current. The electronic test circuit may include an autotransformer operatively coupled to the converter. The autotransformer may be configured to regulate a voltage of the test charge, such that the voltage is suitably high enough to cause failure of the lamp.

This Summary is provided to introduce concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

The present disclosure is directed to failure testing of projection devices. More particularly, the present disclosure is directed to an approach for inducing failure of a projection lamp (referred to herein as a "lamp") installed in a projection device by sending a high-voltage charge through the lamp. By using a high-voltage charge to cause lamp failure, electrical limitations of a lamp being tested may be realized. Moreover, the effects of lamp failure on the projection device in which the lamp being tested is installed may be realized. The present disclosure is described in the context of failure testing of lamps installed in projection devices; however the concepts described herein are broadly applicable to failure testing of a variety of lamps.

Figure 1:
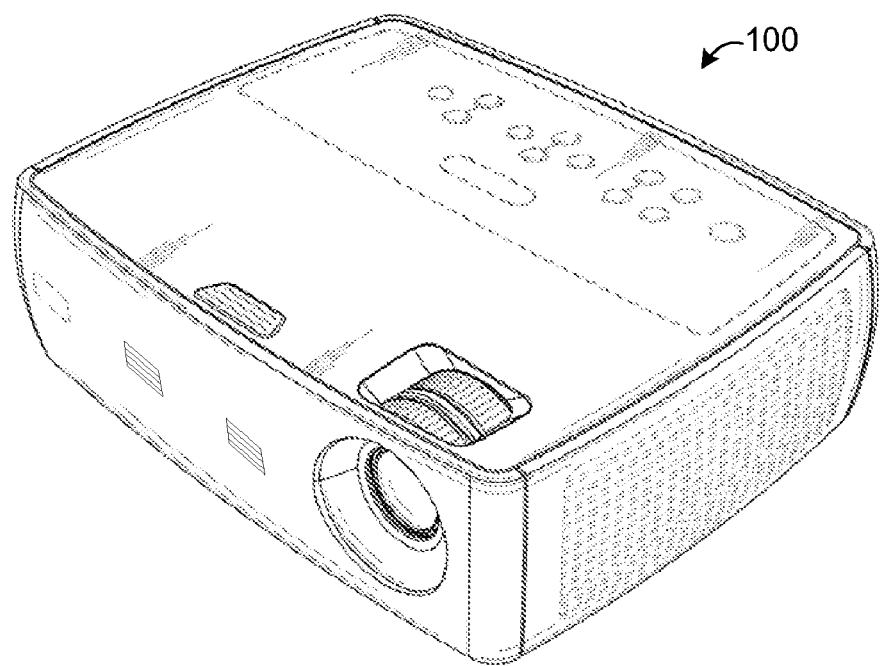
FIG. 1 is a front perspective view of an example projection device of the present disclosure.

FIG. 1 shows an example projection device 100. Projection device 100 is a front-projection device that may be configured to project imagery onto a remote projection screen. Projection device 100 may be tested in a variety of ways in order to meet regulations and standards that deem that the projection device is suitable for use. For example, a projection device may be operationally tested, environmentally tested, functionally tested, safety tested, etc. In one example, the projection device may be utilized in failure testing. In particular, a test may be performed to cause a lamp installed in projection device 100 to fail. As such, projection device 100 also may be referred to herein as a "projection unit under test".

Figure 2:
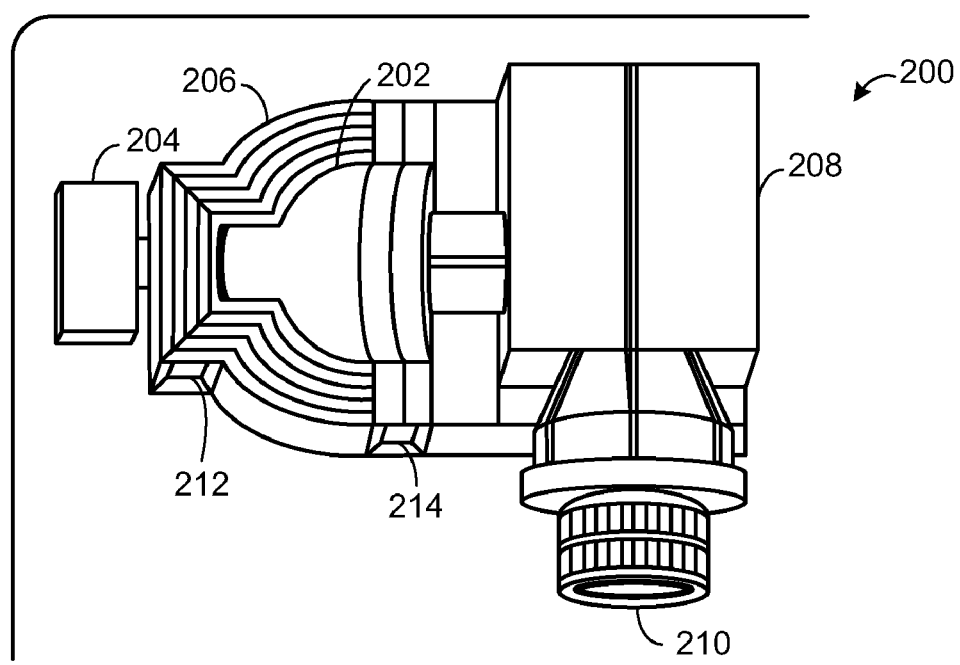
FIG. 2 is a partial top view of a projection lamp module of the projection device of FIG. 1

FIG. 2 shows an example projection lamp module 200 that may be installed in projection device 100 of FIG. 1. Projection lamp module 200 may include a lamp 202 that may be excited with electrical power to generate light for projection. In particular, lamp 202 may have a metal base that facilitates an electrical connection and may be covered with an outer glass bulb to protect inner components of the lamp. In one example, the lamp is a metal-halide lamp that produces light by passing an electric arc through a mixture of gases and metal halides. It will be appreciated that lamp 202 may be virtually any type of lamp that is susceptible to failure.

Light generated by lamp 202 may be directed to imaging system 208 to produce an image that may be projected by lens 210 from the projection device. Imaging system 208 may include virtually any suitable image-generating technology, such as liquid crystal display (LCD) technology, digital light processing (DLP) technology, liquid crystal on silicon (LCOS) technology, etc.

Lamp 202 may be operatively coupled with ballast 204 to regulate an arc current flow of lamp 202. Ballast 204 may be configured to deliver a steady voltage to the arc of lamp 202 as well as to precisely manage the wattage of lamp 202 resulting in steady and accurate light generation and extended lamp life. It will be appreciated that in some embodiments, ballast 204 may be omitted.

Lamp 202 may be surrounded by a thermal dissipater 206 that may be configured to dissipate heat generated during projection device operation away from lamp 202. In particular, thermal dissipater 206 may have thermal properties that efficiently transfer thermal energy from lamp 202 to thermal dissipater 206. Further, thermal dissipater 206 may include an inlet cooling channel 212 and an exhaust cooling channel 214 which may provide air-flow to lamp 202. In some embodiments, a fan may be operatively coupled to inlet cooling channel 212 to provide forced-air cooling to lamp 202. The thermal properties of heat dissipater 206 and air-flow provided by inlet cooling channel 212 and exhaust cooling channel 214 may facilitate cooling of lamp 202.

Due to pressurized gases within lamp 202, in some cases upon failure, the glass bulb of lamp 202 may explode creating numerous particles. Although lamp 202 is surrounded by thermal dissipater 206 which may reduce the spread of the particles, inlet cooling passage 212 and exhaust cooling passage 214 may provide avenues for the particles to disperse into and exit out of the projection device. Particle containment upon lamp failure is one aspect of projection device operation that may be tested and/or observed. In one approach a projection-lamp-particle-containment test device may be utilized to perform a failure test of a lamp installed in a projection device.

Figure 3:
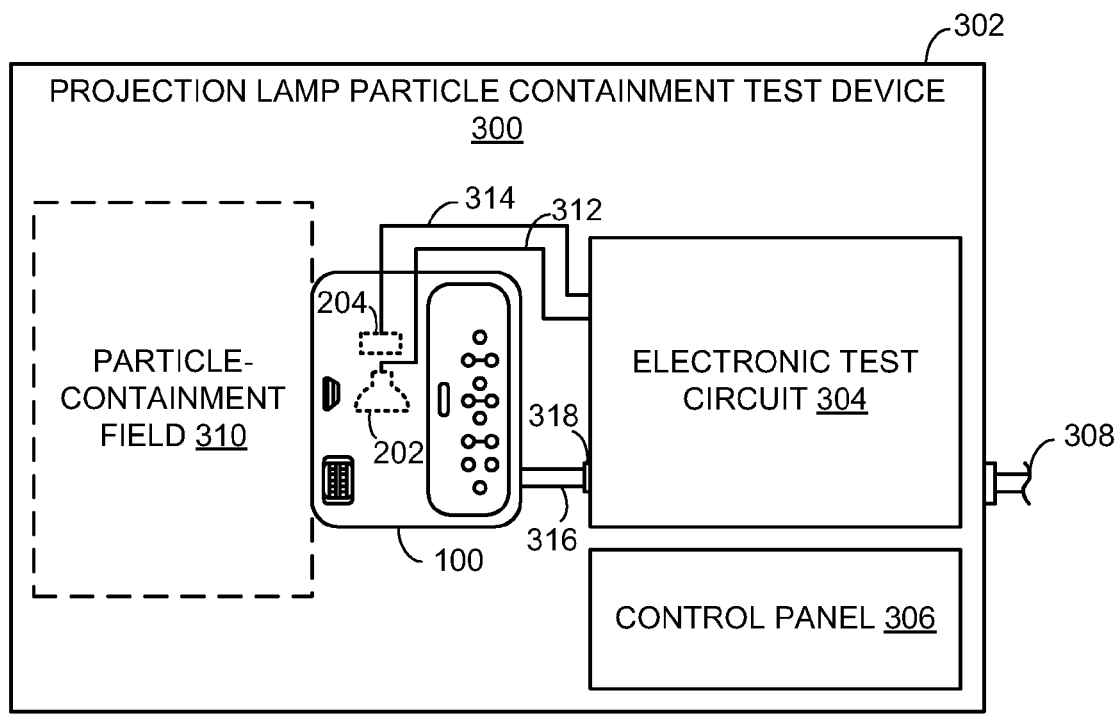
FIG. 3 is a schematic diagram of an example projection-lamp-particle-containment test device of the present disclosure.

FIG. 3 schematically shows an example projection-lamp-particle-containment test device 300 (referred to herein as the "test device" or "test system"). Test device 300 may be configured to induce failure of a lamp installed in a projection unit under test by sending a high-voltage charge through the lamp. The test device may be used to determine the electrical operating limits of the lamp as well as to observe the effects of lamp failure on the projection unit under test and surrounding environment. Test device 300 may include a housing 302 that may be configured to contain a projection unit under test, such as projection device 100. Housing 302 may include insulating material that resists the flow of electric current and keeps high voltage charges from exiting test device 300. The insulating material may also have acoustic insulation properties. Housing 302 may be sized large enough to contain virtually any size projection device.

Test device 300 may include electronic test circuit 304 which may be configured to deliver a high-voltage charge to projection device 100 to induce failure of lamp 202. In order to simulate a realistic operating environment for projection device operation during failure testing, electronic test circuit 304 may include an electrical power outlet 318 configured to receive a power cord 316 of projection device. Thus, electronic test circuit 304 may supply electrical power to projection device 100 for operation during failure testing.

Furthermore, electronic test circuit 304 may be directly connected to lamp 202 and ballast 204 of projection device 100. In particular, lamp 202 may be directly connected to electronic test circuit 304 via electrical connector 312 and ballast 204 may be directly connected to electronic test circuit 304 via electrical connector 314. During failure testing, electrical connectors 312 and 314 may transmit a high-voltage charge through lamp 202 and ballast 204 to induce failure of lamp 202. Electronic test circuit 304 will be discussed in further detail below with reference to FIG. 5.

Test device 300 may receive alternating current electrical power for operation from an alternating current power source 308, such as an electrical power receptacle, for example. In one particular example, test device 300 includes an electrical power plug such as an IEC 320 series power connector that plugs into an electrical power receptacle.

In some embodiments, test device 300 may include a particle-containment field 310. Projection device 100 may be positioned within test device 300, such that upon lamp failure, particles ejected from the projection device may be contained in particle-containment field 310. Particle-containment field 310 may permit particles of an exploded lamp to exit projection device 100 and disperse without interference due to space restraints so that the particles and dispersion patterns may be identified. Moreover, in some embodiments, particle-containment field 310 may include a surface material having a color, texture, and/or other attribute that highlights the lamp particles so that the lamp particles and exit patterns may be easily recognized.

Figure 4:
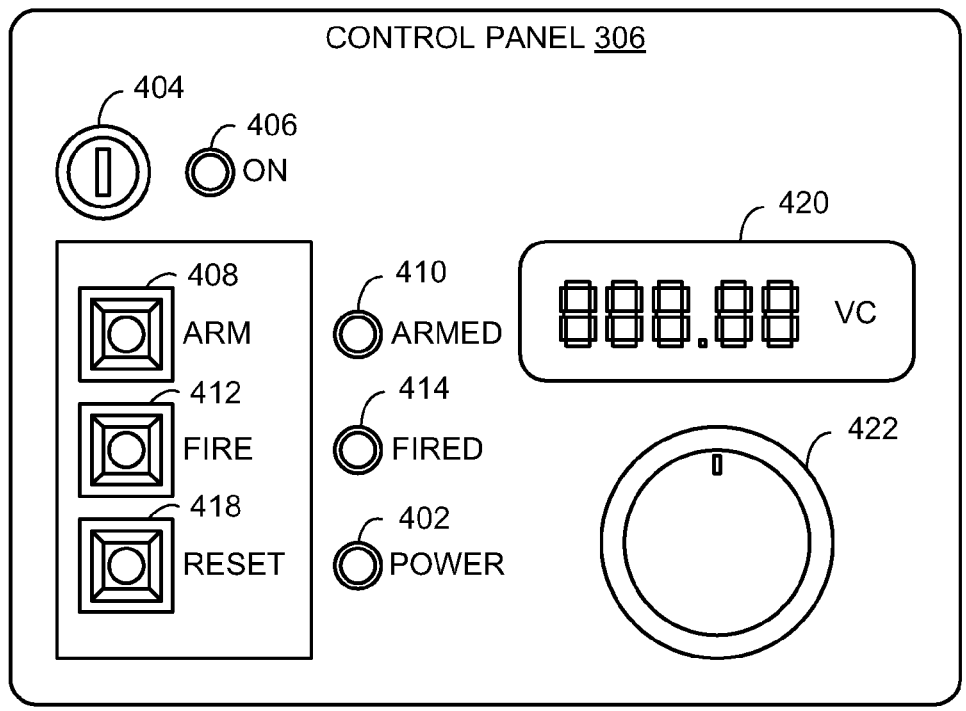
FIG. 4 is a schematic diagram of an example control panel of the projection-lamp-particle-containment test device of FIG. 3.

Test device 300 may include a control panel 306 configured to control operation of test device 300 and, more particularly, electronic test circuit 304. FIG. 4 shows a detailed view of an example control panel 306. Control panel 306 may include a test system power indicator 402 which may be lit in response to test device 300 receiving electrical power. In other words, test system power indicator 402 may indicate whether or not an electrical power plug of the test device is plugged into an electrical power receptacle and receiving electrical power. In a particular example, test system power indicator 402 is an LED.

Control panel 306 may include a key switch 404 which may be configured to receive a key which may be used to toggle key switch 404 between different states of operation. In particular, key switch 404 may be adjusted to a state that provides electrical power to electronic test circuit 304. In other words, key switch 404 may be utilized to turn test device 300 on or off. It will be appreciated that in some embodiments, a different type of switch other than a key switch may be implemented to turn test device 300 on or off. A test system operation indicator 406 may be operatively coupled to key switch 404 such that test system operation indicator 406 indicates when key switch 404 is adjusted to a state that provides electrical power to electronic test circuit 304. In a particular example, test system operation indicator 406 is an LED.

Control panel 306 may include an arm switch 408 configured to activate or deactivate fire switch 412. In other words, arm switch 408 may be configured to be adjusted to a state that permits the test charge to be sent to lamp 202 upon adjustment of fire switch 412. Arm switch 408 may be utilized to reduce the likelihood of premature and/or unintentional firing of test device 300. An armed indicator 410 may be operatively coupled to the arm switch such that armed indicator 410 indicates when arm switch 408 is adjusted to the state that permits the test charge to be sent to the lamp upon adjustment of the fire switch.

Control panel 306 may include fire switch 412 configured to be adjusted to a state that delivers a test voltage to lamp 202 via the electrical connector 312. A fired indicator 414 may be operatively coupled to fire switch 412 such that fired indicator 414 indicates when a test voltage has been sent to lamp 202 via electrical connector 312.

Control panel 306 may include reset switch 418 configured to be adjusted to a state in which electrical current is dumped from test device 300. In particular, after a high-voltage charge has been sent through the lamp of a projection unit under test, electrical power may remain in the electronic test circuit and/or lamp. In order to remove the electrical power, reset switch 418 may be toggled so that current is drawn from electronic test circuit to power or ground. It will be appreciated that current generated by electronic test circuit 304 may be dumped to power or ground without firing a high-voltage charge to lamp 202 upon actuation of reset switch 418.

Control panel 306 may include a user input device 422 configured to receive user input to adjust a voltage of a test charge that is sent to lamp 202 upon actuation of fire switch 412. The voltage of the test charge may be set to a voltage suitably high enough to cause failure of lamp 202. In one example, user input device 422 is a dial that may be rotated to adjust the voltage of the test charge. It will be appreciated that a user input device other than a dial may be used to adjust the voltage of the test charge. The voltage of the test charge and corresponding adjustment may be presented to a user via display 420. The test voltage presented by display 420 may be a voltage generated by electronic test circuit 304 as measured by a voltage meter 516 (see FIG. 5) of electronic test circuit 304. In some embodiments, display 420 may present other operational parameters of the test device and/or the projection unit under test.

Figure 5:
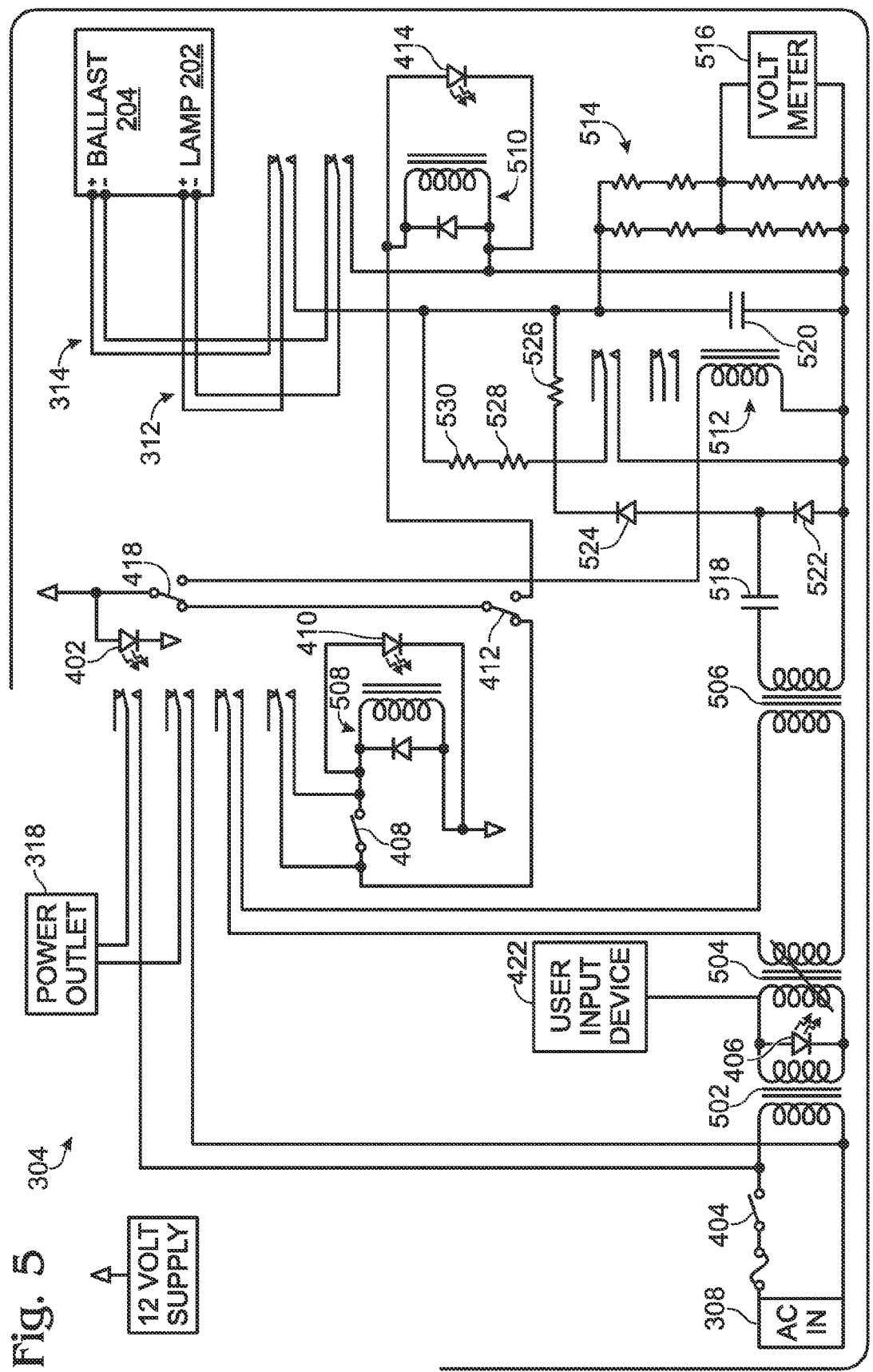
FIG. 5 is a circuit diagram of an example electronic test circuit of the projection-lamp-particle-containment test device of FIG. 3.

FIG. 5 shows an example circuit diagram of electronic test circuit 304 configured to generate a high-voltage test charge to be sent to a lamp of a projection unit under test to induce failure of the lamp. In particular, lamp 202 and ballast 204 of a projection unit under test may be directly connected to electronic test circuit 304 via electrical connectors 312 and 314. Electronic test circuit 304 may receive alternating current electrical power from alternating current power source 308. Alternating current power source 308 may be configured to generate a test charge that may be sent to lamp 202 and ballast 204 via electronic test circuit 304.

Key switch 404 may be actuated between an "off" (open) state in which alternating current power is not provided to electronic test circuit 304 and an "on" (closed) state in which alternating current power is provided to electronic test circuit 304. Power outlet 318 may be operatively coupled with key switch 404 and may be configured to receive a power cord of a projection unit under test. Upon key switch 404 being placed in a closed state, power outlet 318 may provide alternating current power to the projection unit under test for operation.

Electronic test circuit 304 may include a converter 502 configured to receive the test charge to be sent to lamp 202 and ballast 204 from alternating current power source 308. Converter 502 may be operatively coupled to the output of key switch 404 so that converter 502 receives alternating current power when key switch 404 is placed in a closed state. Converter 502 may be configured to convert the alternating current received from alternating current power source 308 to direct current. Converter 502 may include an isolation transformer which may be configured to decouple electronic test circuit 304 from alternating current power source 308. The isolation transformer may block outside signal interference, such as from alternating current power source 308 or the projection unit under test. Further, the isolation transformer may contain electrical charge built up by electronic test circuit 304 within the electronic test circuit so that the built-up charge is not transferred to the power cord of the projection unit under test or the surrounding environment. In one particular example, converter 502 may receive 115/220 volt alternating current and may output 12 volt direct current. Thus, electronic test circuit 304 may have a power supply regulated at 12 volts. Test system power indicator 402 may be directly connected to the power supply and may indicate that electronic test circuit 304 is receiving electrical power. In one example test system power indicator is an LED that lights up to indicate that the electronic test circuit is receiving electrical power or is plugged in to the alternating current power source.

Test system operation indicator 406 may be operatively coupled to the output of converter 502. Test system operation indicator 406 may indicate that test device 300 is operational or "on" based on receiving power from converter 502. In one example, the test system operation indicator is an LED that is lights up to indicate that the test system is operational.

Electronic test circuit 304 may include an autotransformer 504 operatively coupled to converter 502 and indicator 406. Autotransformer 504 may receive a direct current test charge that is output by converter 502. Autotransformer 504 may be configured to precisely regulate a voltage of the test charge. User input device 422 of may be operatively coupled to autotransformer 504 and autotransformer may be configured to regulate the voltage of the test charge based on input to the user input device. In particular, user input device 422 may adjust a state of autotransformer 504 which increases or decreases a regulated voltage output by autotransformer 504. By adjusting the voltage of the test charge utilizing autotransformer 504, known, precise, and repeatable voltage adjustments may be made to the test charge which may result in robust and accurate testing.

Electronic test circuit 304 may include a step-up transformer operatively coupled to the output of autotransformer 504. Step-up transformer 506 may be configured to increase the voltage of the test charge output by autotransformer 504 by a predetermined voltage so that the test charge may achieve a high voltage to induce lamp failure. In one example, the step-up transformer increases the voltage of the test charge by a ratio of 1:13 input to output. A filter capacitor 518 may be coupled in series with the output of step-up transformer 506. Filter capacitor 510 may filter signal noise of the test charge so that an accurate voltage may be sent to lamp 202 and ballast 204. High-voltage diodes 522 and 524 may be coupled to the output of filter capacitor 510. High-voltage diodes 522 and 524 may prevent current of the test charge from leaking back to step-up transformer 506 which may prevent the voltage of the test charge from dropping. The high-voltage test charge may travel across resistor 526 to electrical connectors 312 and 314 and be sent to lamp 202 and ballast 204 upon actuation of fire switch 412. Resistors 530 and 528 may provide a resistance that draws the test charge to the electrical connectors 312 and 314. A decoupling capacitor 520 may be coupled between electrical connectors 312 and 314 and ground. Decoupling capacitor 520 may shunt signal noise generated by elements of electronic test circuit 304, such as signal noise generated by the plurality of resistors 514, reducing the effects of signal noise on the rest of the circuit.

Electronic test circuit 304 may include arm switch 408 which may be operatively coupled at the output of autotransformer 504. Arm switch 408 may be configured to be adjusted to a state that permits the test charge to be sent to the lamp upon adjustment of the fire switch. In other words, for the closing of fire switch 412 to cause the test charge to be sent to the lamp, arm switch 408 should be in a closed state. Placing arm switch 408 in the closed state may permit the voltage of the test charge output by autotransformer 504 to be increased to a high voltage by step-up transformer 506. Armed indicator 410 may be operatively coupled to arm switch 408 such that armed indicator 410 is lit in response to arm switch 408 being adjusted to the state that permits the test charge to be sent to the lamp upon adjustment of the fire switch (i.e. when arm switch 408 is closed). Armed indicator 410 may provide an indication when electronic test circuit 304 is armed with a test charge to be sent to a lamp of a projection unit under test. In one example, armed indicator 410 is an LED that lights up to indicate that electronic test circuit 304 is armed. An arm switch relay 508 may be coupled to arm switch 408 to protect components of electronic test circuit 304 from changes in electrical potential as a result of actuation of arm switch 408.

Electronic test circuit 304 may include fire switch 412 which may be operatively coupled to arm switch 408. Fire switch 412 may be configured to be adjusted to a state that delivers the high-voltage test charge to lamp 202 and ballast 204 via the electrical connector 312 and 314 when electronic test circuit 304 is armed (i.e. arm switch 408 is closed). In particular, closing fire switch 412 may apply the high-voltage test charge to switches of electrical connectors 312 and 314 which changes the state of electrical connectors 312 and 314 to send the high-voltage test charge to lamp 202 and ballast 204. Fired indicator 414 may be operatively coupled to fire switch 412 such that fired indicator 414 may provide an indication that electronic test circuit 304 has applied the high-voltage test charge to lamp 202 and ballast 204. In one example, fired indicator 414 is an LED that lights up in response to fire switch 412 being adjusted to the state that delivers the test charge to lamp 202 and ballast 204 via the electrical connectors 312 and 314. A fire switch relay 510 may be coupled to fire switch 412 to protect components of electronic test circuit 304 from changes in electrical potential as a result of actuation of fire switch 412.

Electronic test circuit 304 may include voltage meter 516 configured to measure the voltage of the test charge to be sent to lamp 202 and ballast 204. In particular, the test charge may travel across a plurality of resistors 514 arranged to create a voltage divider to reduce the voltage of the test charge by a known amount. Voltage meter 516 may measure the scaled down voltage in order to have high measurement accuracy so that precision adjustment of the voltage of the test charge may be performed. The plurality of resistors 514 may have high voltage ratings to handle the high-voltage test charge. For example, two two-million ohm resistors may be arranged in series with two two-thousand ohm resistors. In one example, the plurality of resistors may create a voltage divider having a 100:1 voltage reduction ratio. By providing a precise measurement of the voltage of the test charge via voltage meter 516, a user may realize the voltage of the test charge so that a desired voltage may be achieved and repeatedly sent to different lamps of projection units under test throughout a barrage of testing.

Electronic test circuit 304 may include reset switch 418 configured to be adjusted to a state that dumps current of the test charge from the electronic test circuit 304. In particular, reset switch 418 may be placed in a state that creates a short circuit between power and ground to dump current of the test charge from electronic test circuit 304. Reset switch 418 may be used to dump current residing on electronic test circuit 304 after the test charge has been sent to lamp 202 and ballast 204 or may be used to dump current of the test charge to abort sending the test charge to lamp 202 and ballast 204. A reset switch relay 512 may be coupled to reset switch 418 to protect components of electronic test circuit 304 from changes in electrical potential as a result of actuation of reset switch 418.

The accuracy of the voltage adjustment and regulation of the test charge delivered to a lamp of a projection unit under test by electronic test circuit 304 may facilitate improved analysis of the test results since an accurate measurement of the voltage may be known, regulated, and delivered repeatedly. While various specific circuit arrangements are described above, it is to be understood that other (or additional) circuitry may be included in the electronic test circuit and is within the scope of this disclosure. For example, the test circuit may include circuitry to measure operating voltage levels of other components in a unit under test. As another example, the test device may include multiple connections to deliver different voltages to different components of a unit under test. Furthermore, it is to be understood that the test device may include circuitry suitable to produce accurately controllable electrical charges in order to generate lamp rupture events.

Figure 6:
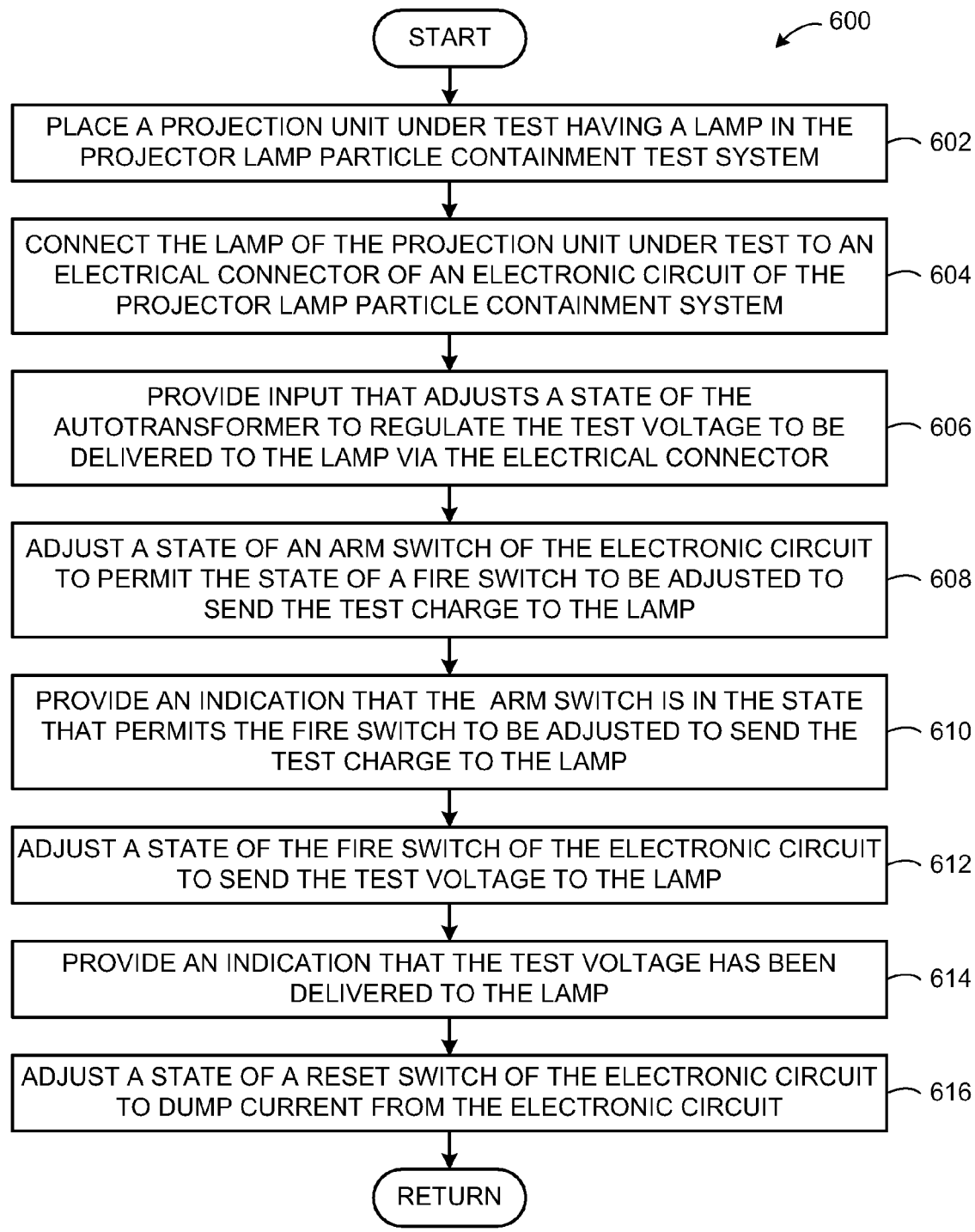
FIG. 6 is a flow diagram of an example method for performing a failure test of a lamp of a projection device.

FIG. 6 shows a flow diagram of an example method 600 for performing a failure test of a lamp of a projection unit under test. Method 600 begins at 602, where the method may include placing a projection unit under test that has a lamp installed in the projection unit under test in a projection-lamp-particle-containment test device, such as test device 300 described above. The test device may be configured to contain particles of a ruptured lamp generated as a result of sending a high-voltage test charge to the lamp.

At 604, the method may include connecting the lamp of the projection unit under test to an electrical connector of an electronic test circuit of the projection-lamp-particle-containment test device. The electronic test circuit of the test device may be configured to generate a test charge to be sent to the lamp via the electrical connector. By connecting the electronic test circuit directly to the lamp the likelihood of rupturing the lamp may be increased over attempting to rupture the lamp by sending a test charge through the projection unit under test.

At 606, the method may include providing input that adjusts a state of an autotransformer of the electronic test circuit to regulate a voltage of the test charge at a voltage suitably high enough to cause failure of the lamp. Input may be provided via a user input device connected to the autotransformer. The user input device may facilitate precise voltage adjustment by the autotransformer for increased testing accuracy.

At 608, the method may include adjusting a state of an arm switch of the electronic circuit that permits the test charge to be sent to the lamp upon adjustment of the fire switch. In other words, the method may include actuating the arm switch to generate a high-voltage test charge and closing the electronic test circuit up to the fire switch so that upon actuation of the fire switch the high-voltage test charge is sent to the lamp.

At 610, the method may include providing an indication that the arm switch is in the state that permits the test charge to be sent to the lamp upon adjustment of the fire switch. In one example, the electronic test circuit may include an LED which may be operatively coupled to the arm switch such that the LED is lit when the electronic test circuit is armed.

At 612, the method may include adjusting a state of a fire switch of the electronic test circuit to send the test charge to the lamp. At 614, the method may include providing an indication that the test charge has been sent to the lamp in response to the fire switch being adjusted to the state that sends the test charge to the lamp. The indication may be presented to a user of the test device so that the user may identify the state of the test device, and more particularly, whether or not a high-voltage test charge is currently generated by the electronic test circuit. In one example, the indication may be provided by an LED that is lit in response to actuation of the fire switch.

At 616, the method may include adjusting a state of a reset switch of the electronic test circuit to dump current of the test charge from the electronic test circuit. The reset switch may be adjusted to dump residual current from a test charge that had been sent to the lamp or to dump current from a test charge that has not been applied to the lamp. In some cases, adjusting the reset switch may also adjust the state of the fire switch and/or the arm switch.

By utilizing the test device for lamp failure testing, a lamp of a projection unit under test may be induced to fail and rupture and lamp particles may be contained within the test device. Further, by connecting the lamp to the electronic test circuit a test charge may be sent directly to the lamp to dramatically increase the likelihood of lamp failure. Utilizing the test device, the test charge delivered to the lamp may be adjusted and regulated with a high degree of accuracy. The accuracy of the voltage regulation and delivery by the test device may facilitate improved analysis of the test results since an accurate measurement of the voltage may be known, regulated, and delivered repeatedly.

It will be understood that the embodiments herein are illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A projector lamp electronic test circuit, comprising:
   An electrical connector configured to be operatively coupled to a lamp of a projection unit under test;
   a converter configured to receive a test charge to be sent to the lamp from an alternating current power source, the converter configured to convert the test charge from alternating current to direct current; and
   an autotransformer operatively coupled to the converter, the autotransformer configured to regulate a voltage of the test charge, the voltage being suitably high enough to cause failure of the lamp.

2. The circuit of claim 1, wherein the autotransformer regulates the voltage of the test charge sent to the lamp based on input to a user input device operatively coupled to the autotransformer.

3. The circuit of claim 1, further comprising:
   a step-up transformer operatively coupled to the autotransformer, the step-up transformer configured to increase the voltage of the test charge by a predetermined voltage.

4. The circuit of claim 1, wherein the electrical connector is further configured to be operatively coupled to a ballast that is operatively coupled to the lamp, and the autotransformer is further configured to regulate the voltage of the test charge to be sent to the ballast and the lamp.

5. The circuit of claim 1, further comprising:
   a fire switch configured to be adjusted to a state that delivers the test charge to the lamp via the electrical connector.

6. The circuit of claim 5, further comprising:
   an arm switch configured to be adjusted to a state that permits the test charge to be sent to the lamp upon adjustment of the fire switch.

7. The circuit of claim 1, further comprising:
   a reset switch configured to be adjusted to a state that dumps current of the test charge from the projector lamp electronic test circuit.

8. A projector lamp particle containment test system, comprising:
   a housing to contain a projection unit under test;
   an electrical connector configured to be operatively coupled to a lamp of the projection unit under test;
   a converter configured to receive a test charge to be sent to the lamp from an alternating current power source, the converter configured to convert the test charge from alternating current to direct current; and
   an autotransformer operatively coupled to the converter, the autotransformer configured to regulate a voltage of the test charge based on input from a user input device operatively coupled to the autotransformer, the user input device being configured to adjust the voltage of the test charge to a voltage suitably high enough to cause failure of the lamp.

9. The system of claim 8, further comprising:
   a voltage meter configured to measure the voltage of the test charge to be sent to the lamp.

10. The system of claim 9, further comprising:
    a control panel including:
       a display configured to present the voltage of the test charge as measured by the voltage meter;
       the user input device;
       a fire switch configured to be adjusted to a state that delivers the test charge to the lamp via the electrical connector;
       an arm switch configured to be adjusted to a state that permits the test charge to be sent to the lamp upon adjustment of the fire switch; and
       a reset switch configured to be adjusted to a state that dumps current of the test charge from the projector lamp particle containment test system.

11. The system of claim 10, wherein the control panel further includes:
    a light emitting diode operatively coupled to the fire switch such that the light emitting diode is lit in response to the fire switch being adjusted to the state that delivers the test charge to the lamp via the electrical connector; and
    a light emitting diode operatively coupled to the arm switch such that the light emitting diode is lit in response to the arm switch being adjusted to the state that permits the test charge to be sent to the lamp upon adjustment of the fire switch.

12. The system of claim 8, wherein the user input device is a dial.

13. The system of claim 8, wherein the housing is shaped to include a particle containment field configured to contain lamp particles generated as a result of lamp failure during testing.

14. The system of claim 8, further comprising:
    an electrical power outlet operatively coupled to the alternating current power source, the electrical power outlet configured to receive an electrical power cord of the projection unit under test and configured to provide electrical power from the alternating current source to the projection unit under test.

15. The system of claim 8, further comprising
    a key switch configured to be adjusted to a first state in which the alternating current power source provides electrical power to the converter and a second state in which the alternating current power source does not provide electrical power to the converter.

16. The system of claim 8, further comprising:
    a light emitting diode operatively coupled to the key switch such that the light emitting diode is lit in response to the key switch being adjusted to the first state.

17. A method for failure testing a lamp of a projection unit under test, comprising:
    placing a projection unit under test having a lamp in a projector lamp particle containment test device;
    connecting the lamp of the projection unit under test to an electrical connector of an electronic test circuit of the projector lamp particle containment test device, the electronic test circuit configured to generate a test charge to be sent to the lamp via the electrical connector;

providing input that adjusts a state of an autotransformer of the electronic test circuit to regulate a voltage of the test charge at a voltage suitably high enough to cause failure of the lamp; and adjusting a state of a fire switch of the electronic test circuit to send the test charge to the lamp.

18. The method of claim 17, further comprising:

adjusting a state of an arm switch of the electronic circuit that permits the test charge to be sent to the lamp upon adjustment of the fire switch; and providing an indication that the arm switch is in the state that permits the test charge to be sent to the lamp upon adjustment of the fire switch.

19. The method of claim 17, further comprising:

providing an indication that the test charge has been sent to the lamp in response to the fire switch being adjusted to the state that sends the test charge to the lamp.

20. The method of claim 17, further comprising:

adjusting a state of a reset switch of the electronic test circuit to dump current of the test charge from the electronic test circuit.

\* \* \* \* \*